(12) United States Patent
Dotta et al.

(10) Patent No.: US 11,195,965 B2
(45) Date of Patent: Dec. 7, 2021

(54) SOLAR CELL MODULE, WIRING SHEET, AND METHOD OF MANUFACTURING WIRING SHEET

(71) Applicant: SHARP KABUSHIKI KAISHA, Sakai (JP)

(72) Inventors: Yoshihisa Dotta, Sakai (JP); Hajime Horinaka, Sakai (JP); Kohichi Katohno, Sakai (JP); Liumin Zou, Sakai (JP); Tetsuyoshi Inoue, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 182 days.

(21) Appl. No.: 16/168,739

(22) Filed: Oct. 23, 2018

(65) Prior Publication Data

US 2019/0131466 A1 May 2, 2019

(30) Foreign Application Priority Data

Oct. 26, 2017 (JP) .............................. JP2017-207565

(51) Int. Cl.
*H01L 31/05* (2014.01)
*H01L 31/02* (2006.01)
*H01L 31/0224* (2006.01)
*H01L 31/048* (2014.01)

(52) U.S. Cl.
CPC .... *H01L 31/0516* (2013.01); *H01L 31/02021* (2013.01); *H01L 31/022425* (2013.01); *H01L 31/022441* (2013.01); *H01L 31/048* (2013.01)

(58) Field of Classification Search
CPC ....... H01L 31/02021; H01L 31/022441; H01L 31/05–0516; H01L 31/048; H01L 31/022425; Y02E 10/50
See application file for complete search history.

(56) References Cited

U.S. PATENT DOCUMENTS

| | | | |
|---|---|---|---|
| 9,224,880 B2 | 12/2015 | Yamada et al. | |
| 2010/0263718 A1* | 10/2010 | Abiko | H01L 31/022441 136/252 |
| 2014/0090698 A1* | 4/2014 | Kumai | H05K 3/20 136/251 |

FOREIGN PATENT DOCUMENTS

| | | |
|---|---|---|
| JP | 2012099569 A | 5/2012 |
| WO | 2011/011855 A1 | 2/2011 |

* cited by examiner

*Primary Examiner* — Lindsey A Bernier
(74) *Attorney, Agent, or Firm* — ScienBiziP, P.C.

(57) ABSTRACT

Wires (22) electrically connecting solar cells (10) include first wires (22a) and second wires (22b). The first wires (22a) are connected to the first-conductivity-type electrodes (12) of a first one of the solar cells (10) and the second-conductivity-type electrodes (13) of a second one of the solar cells 10 that is adjacent to the first one of the solar cells (10). The second wires (22b) are connected to the second-conductivity-type electrodes (13) of the first one of the solar cells (10) and the first-conductivity-type electrodes (12) of the second one of the solar cells (10). The second wires (22b) are electrically separated by holes (21a) extending through both the second wires (22b) and an insulating base member (21).

10 Claims, 13 Drawing Sheets

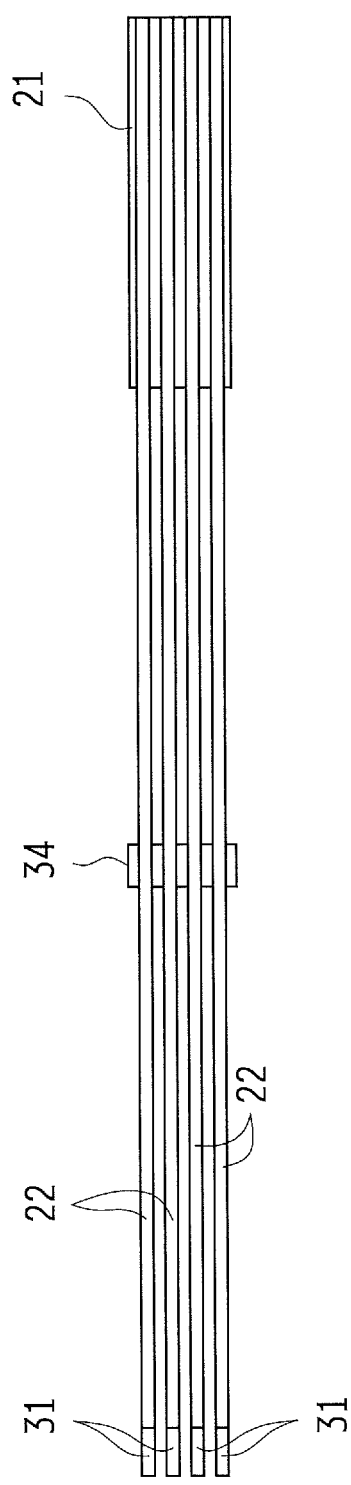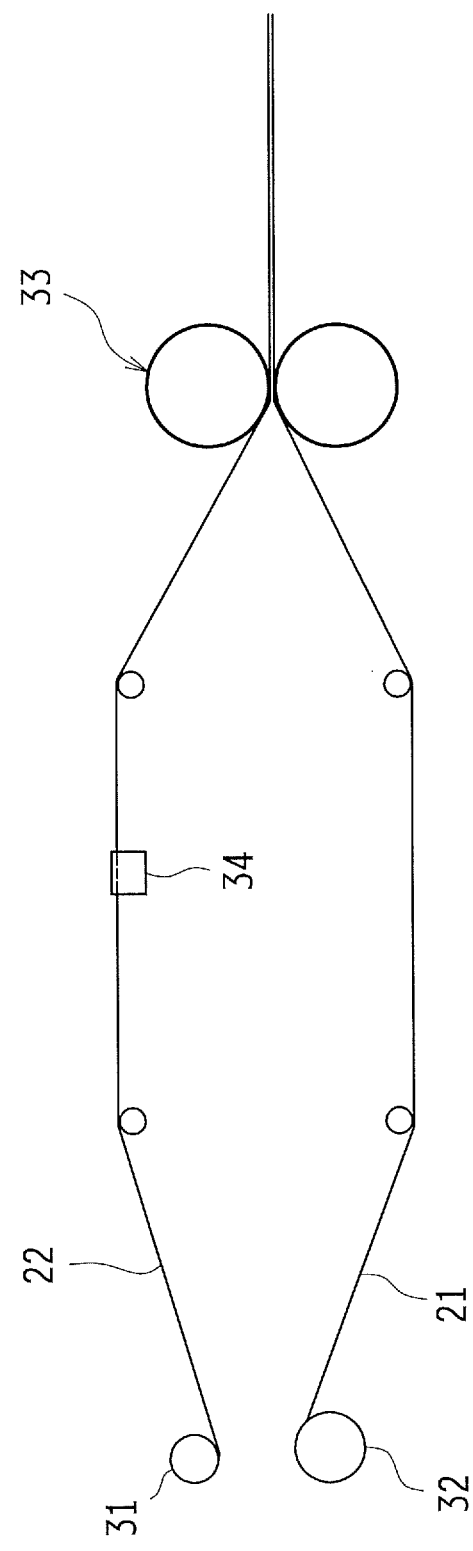
FIG.7(a)
FIG.7(b)

SOLAR CELL MODULE, WIRING SHEET, AND METHOD OF MANUFACTURING WIRING SHEET

CROSS-REFERENCE TO RELATED APPLICATIONS

The present application hereby claims priority under 35 U.S.C. § 119(a) to Japanese Patent Application, Tokugan, No. 2017-207565 filed on Oct. 26, 2017, the entire contents of which are incorporated herein by reference.

FIELD OF THE INVENTION

The present invention relates in general to backside-electrode solar cell modules and in particular to wiring sheets provided with wires for connecting backside electrodes of a plurality of solar cells and methods of manufacturing such wiring sheets.

BACKGROUND OF THE INVENTION

Technology has been known of mounting, on a wiring sheet carrying preformed metal wires thereon, a plurality of solar cells provided with preformed electrodes on the back faces thereof. In a solar cell module disclosed in Japanese Unexamined Patent Application Publication, Tokukai, No. 2012-99569, as an example, a plurality of solar cells are disposed along the length of an elongated, rectangular wiring board (wiring sheet), and adjacent solar cells are electrically connected in series.

For such a configuration, each area of the wiring board on which a solar cell is mounted is provided thereon with a plurality of wires shaped like narrow strips for use with p-type members ("p-type-use wires") and a plurality of wires shaped like narrow strips for use with n-type members ("n-type-use wires") in parallel, respectively for p-type electrodes and n-type electrodes provided on the back face of the solar cell. These p- and n-type-use wires are extended along the length of the wiring board and when viewed along the width of the wiring board, are provided alternately.

Between each pair of adjacent solar cells are there also provided rectangular connection electrodes that connect an assembly of the p-type-use wires of a first one of the two solar cells to an assembly of the n-type-use wires of the other, second solar cell. In other words, an interdigitated wiring pattern of the p-type-use wires and connection electrodes is formed for the first solar cell, an interdigitated wiring pattern of the n-type-use wires and connection electrodes is formed for the second solar cell, and a combination of these interdigitated wiring patterns straddle the two adjacent solar cells.

This conventional wiring sheet has problems. The interdigitated wiring patterns for each pair of adjacent solar cells need to be combined so as to straddle the pair of solar cells, which requires formation of complex metal wiring. That in turn requires a photolithography process, adding to the manufacturing time of the wiring sheet and hence to the total manufacturing time of the solar cell module. In addition, the etching and mask-removing steps may leave etchant, conductive foreign objects, and unnecessary materials unremoved between wires on the base member. These residues will likely cause short-circuiting, which can be an issue.

SUMMARY OF THE INVENTION

The present invention, made in view of these problems, has an object to provide such a solar cell module, wiring sheet, and method of manufacturing the wiring sheet as to simplify a metal wiring pattern on the wiring sheet used in the solar cell module for increased productivity.

Solution to the Problems

To achieve the object, the present invention provides the following solar cell module, wiring sheet, and method of manufacturing the wiring sheet.

(1) Solar Cell Module

The present invention is directed to a solar cell module including: solar cells each including first-conductivity-type electrodes and second-conductivity-type electrodes on one of faces of a semiconductor substrate; and a wiring sheet including wires on an insulating base member, wherein: the solar cells include a first solar cell and a second solar cell that are disposed in a prescribed cell array direction and that are electrically connected by the wires; the wires are shaped like strips extending in the cell array direction and include first wires and second wires disposed side by side in a direction intersecting the cell array direction; and the first and second wires extend straddling the first and second solar cells.

The first wires are connected to the first-conductivity-type electrodes of the first solar cell and to the second-conductivity-type electrodes of the second, adjacent solar cell. The second wires are connected to the second-conductivity-type electrodes of the first solar cell and to the first-conductivity-type electrodes of the second solar cell. In addition, the second wires are electrically separated by holes extending through both the second wires and the insulating base member.

(2) Wiring Sheet

The present invention is directed also to a wiring sheet for disposing a first solar cell and a second solar cell side by side in a prescribed cell array direction for electric connection between the first and second solar cells, the first and second solar cells each including first-conductivity-type electrodes and second-conductivity-type electrodes on one of faces of a semiconductor substrate, the wiring sheet including: an insulating base member, and wires on the insulating base member, wherein: the wires are shaped like strips extending in the cell array direction and include first wires and second wires disposed side by side in a direction intersecting the cell array direction; and the first and second wires extend straddling areas in which the first and second solar cells are to be disposed.

The first wires are located so as to connect to the first-conductivity-type electrodes of the first solar cell and to the second-conductivity-type electrodes of the second, adjacent solar cell. The second wires are located so as to connect to the second-conductivity-type electrodes of the first solar cell and to the first-conductivity-type electrodes of the second solar cell. In addition, the second wires are electrically separated by holes that extend through both the second wires and the insulating base member.

(3) Method of Manufacturing Wiring Sheet

The present invention is directed further to a method of manufacturing a wiring sheet for electrically connecting, using wires on an insulating base member, a plurality of solar cells each including first-conductivity-type electrodes and second-conductivity-type electrodes on one of faces of a semiconductor substrate, the method including: the provision step of extending a plurality of wiring members constituting the wires in a direction in which the solar cells are to be disposed and disposing, on the insulating base member, the plurality of wiring members side by side in a direction intersecting the direction in which the plurality of wiring members is extended; and the removing step of removing the plurality of wiring members and the insulating base member so as to form holes through both the wires and the insulating base member.

Advantageous Effects of the Invention

The solar cell module in accordance with the present invention has both a base member and wires thereof physically removed where the wiring pattern on a wiring sheet should be electrically divided. The structure achieves reliable division, thereby improving the reliability of the solar cell module.

The method of manufacturing a wiring sheet for use in a solar cell module in accordance with the present invention forms a wiring pattern by two simple steps: a step of fixedly attaching wires to a base member and a step of removing the wires and the base member where the wiring pattern should be electrically divided. The method reduces manufacturing time.

BRIEF DESCRIPTION OF DRAWINGS

FIGS. 7(a) and 7(b) are schematic views illustrating a method of manufacturing the wiring sheet, FIGS. 7(a) and 7(b) being a plan view and a side view respectively.

DESCRIPTION OF EMBODIMENTS

The following will describe solar cell modules, wiring sheets, and methods of manufacturing the wiring sheets in accordance with embodiments of the present invention in reference to drawings.

Embodiment 1

Figure 1:
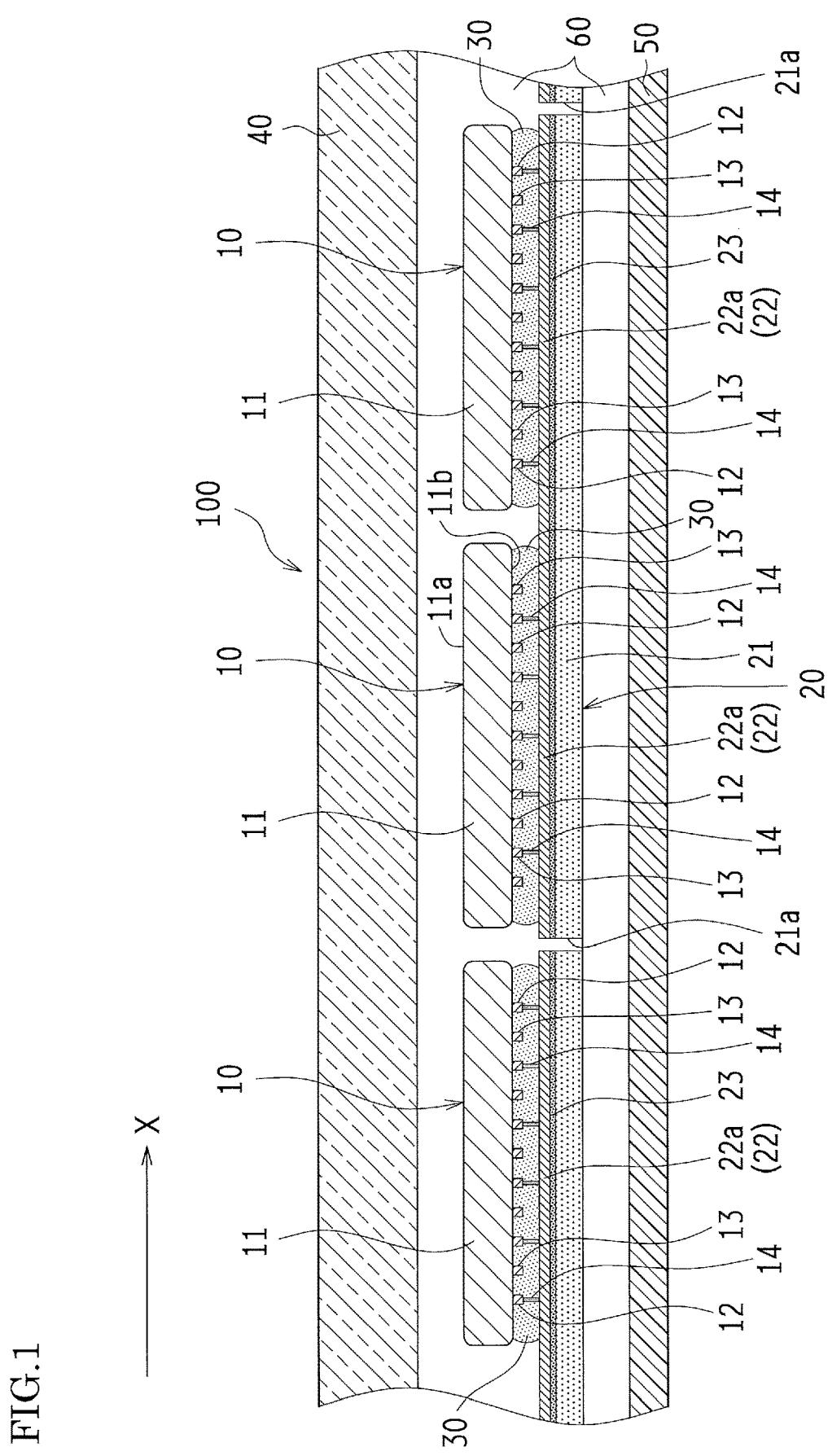
FIG. 1 is a schematic cross-sectional view of a solar cell module in accordance with Embodiment 1 of the present invention, taken along a cell array direction.
Figure 2:
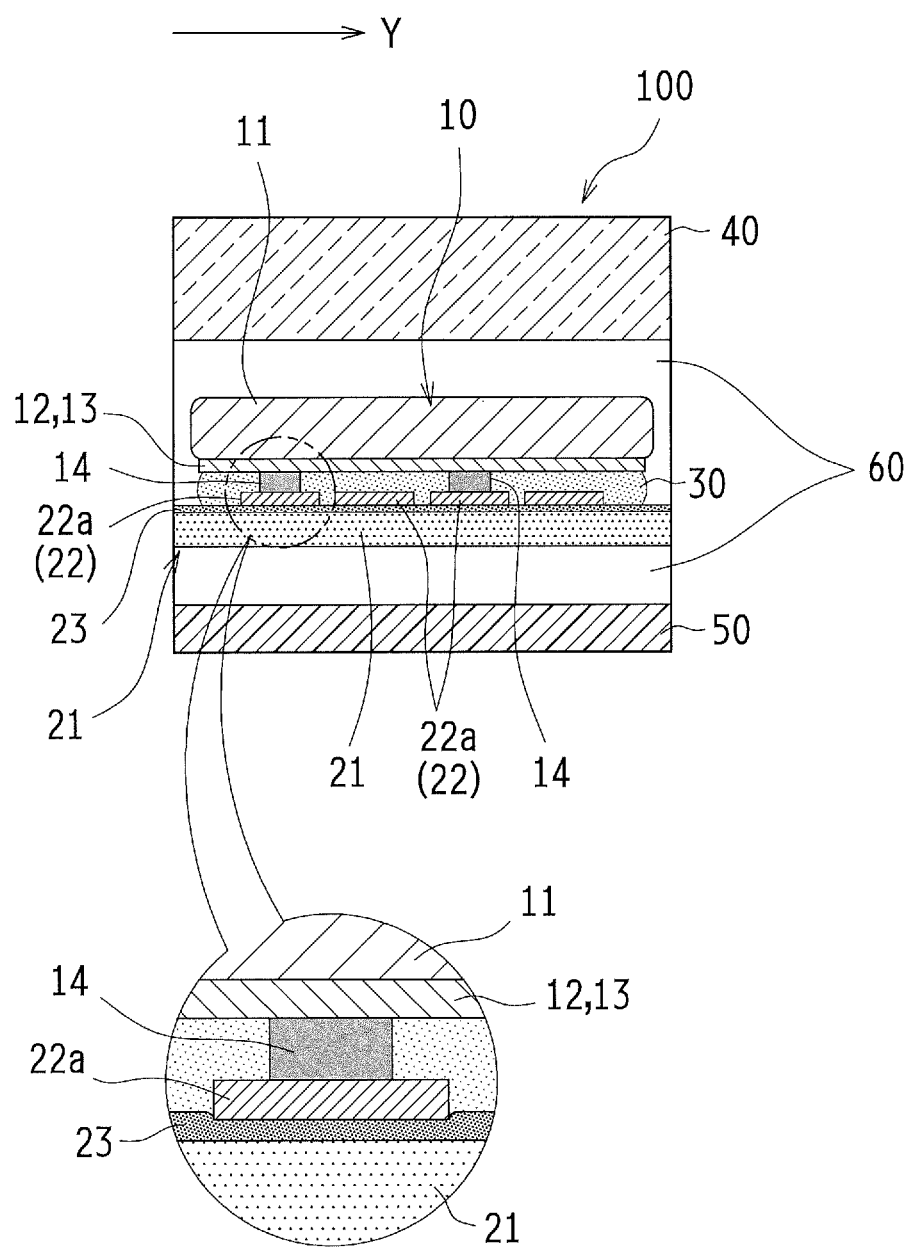
FIG. 2 is a schematic cross-sectional view of the solar cell module, taken along a direction that intersects the cell array direction.
Figure 3:
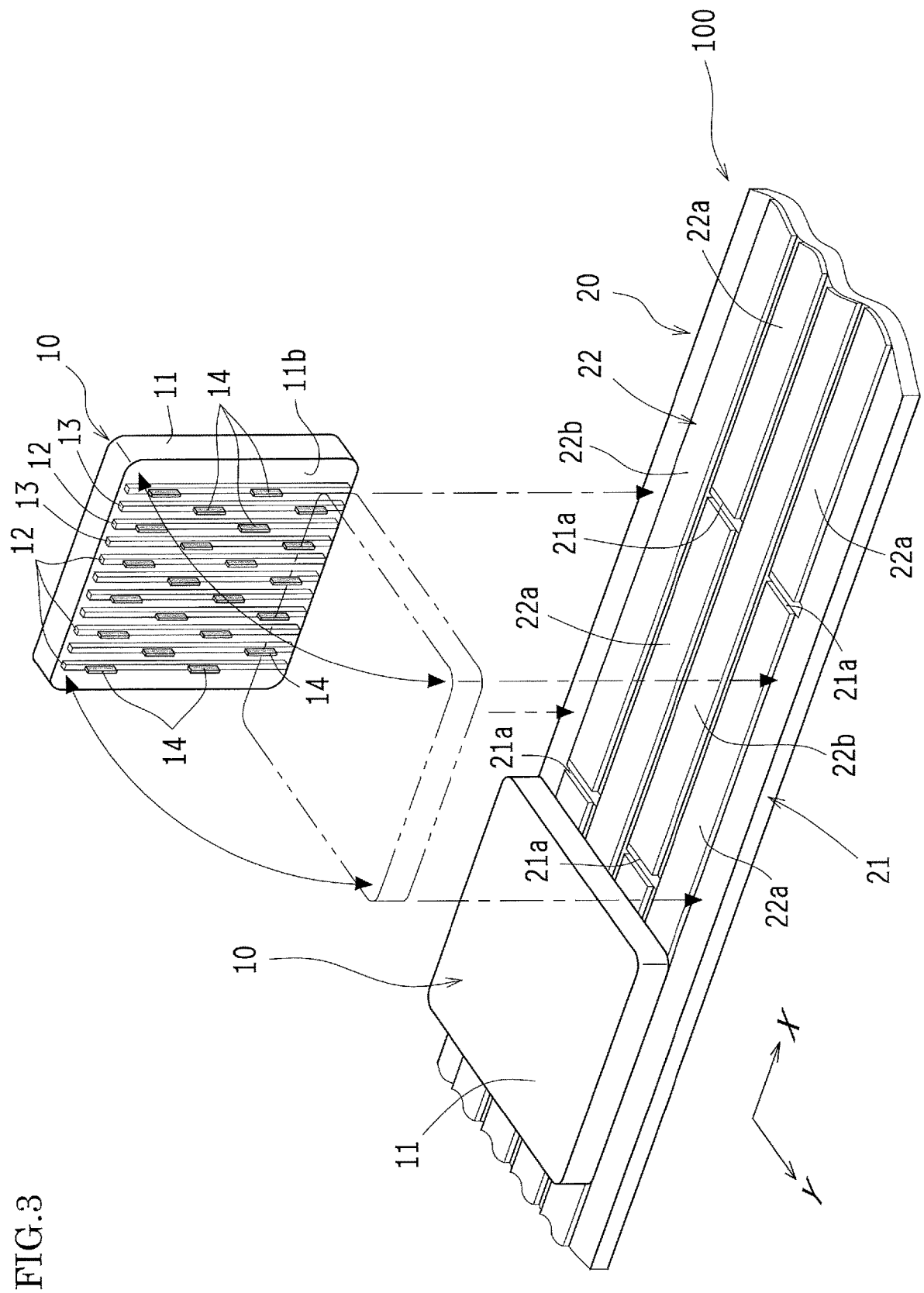
FIG. 3 is a schematic exploded perspective view of the relative positions of backside electrodes of a solar cell used in the solar cell module and metal wires on the wiring sheet connected to the backside electrodes.

FIGS. 1 to 3 are schematic cross-sectional views of a structure of a solar cell module 100 in accordance with Embodiment 1 of the present invention. As shown in FIGS. 1 to 3, the solar cell module 100 includes solar cells 10, a wiring sheet 20, an adhesive 30, a transparent substrate 40, a back-face-protection member 50, and an encapsulant 60. Each solar cell 10 is of a backside-electrode (back-contact) type and includes a semiconductor substrate on one of the faces of which are there provided first-conductivity-type electrodes and second-conductivity-type electrodes. The first- and second-conductivity-type electrodes are connected electrically to diffusion layers of different polarities. The wiring sheet 20 includes an insulating base member on which wires are provided. The adhesive 30 fixes the solar cells 10 to the wiring sheet 20.

If a frame body (not shown) is attached around the solar cell module 100, the term, "solar cell module," is herein used inclusive of such a frame body. One of the faces of a semiconductor substrate 11 on which the first- and second-conductivity-type electrodes are provided will be referred to as a back face 11b (of the solar cell 10), and the opposite face will be referred to as a front face 11a where sunlight is received ("light-receiving face").

The solar cell module 100 is, roughly speaking, structured such that the solar cells 10 and the wiring sheet 20, fixed to each other by the adhesive 30, are sealed with the encapsulant 60 between the transparent substrate 40 and the back-face-protection member 50. The transparent substrate 40 is made of glass, transparent plastic, or a similarly translucent material and shaped like a plate. The back-face-protection member 50 may be a weather-resistant film or sheet of resin or a platelike member made of, for example, glass, plastic, or metal.

Referring to FIG. 1, in the solar cell module 100 in accordance with the present embodiment, the solar cells 10 are disposed side by side on the wiring sheet 20 along a prescribed, X direction (the left/right direction in FIG. 1, which will hereinafter be referred to as the "cell array direction").

FIG. 1 shows only three of the solar cells 10 being disposed side by side in the cell array direction X for convenience of description. A typical solar cell module includes such a number of solar cells provided side by side in the cell array direction X as to deliver a desirable power generation capacity. Likewise, FIG. 2 shows only one of the solar cells 10 for convenience of description. A typical solar cell module includes two or more solar cells provided side by side.

Figure 4:
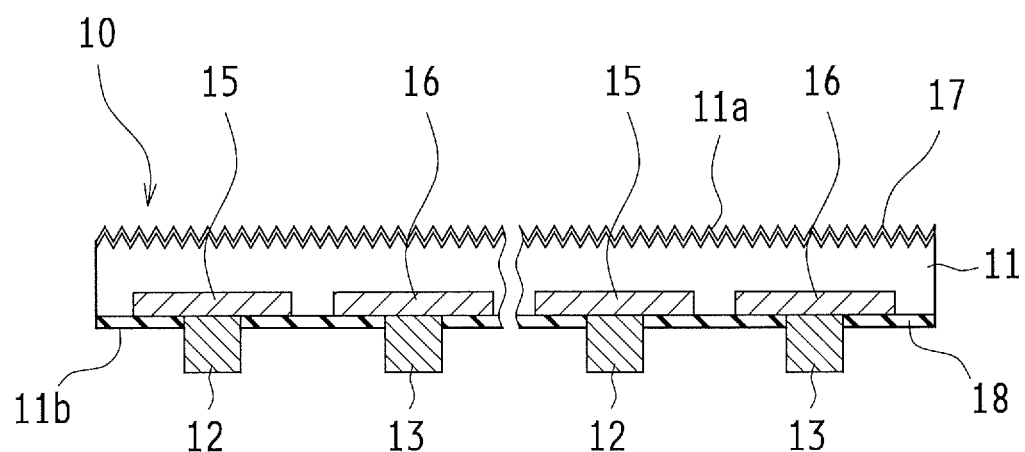
FIG. 4 is a cross-sectional view of the solar cell.

The following will describe the present embodiment on the assumption that the backside-electrode-based solar cells 10 are, as an example, back-contacted solar cells. For example, as shown in FIG. 4, each back-contacted solar cell 10 includes n-type-impurity-diffused regions 15 and p-type-impurity-diffused regions 16 at suitable intervals on the back face 11b of the semiconductor substrate 11. The semiconductor substrate 11 may be of either conductivity type, negative or positive.

The semiconductor substrate 11 may be, for example, a monocrystalline or polycrystalline silicon substrate. The n-type-impurity-diffused regions 15 contain an n-type impurity (donor) and exhibits negative conductivity. The n-type impurity may be, for example, a pentavalent element such as phosphorus or arsenic. The p-type-impurity-diffused regions 16 contain a p-type impurity (acceptor) and exhibits positive conductivity. The p-type impurity may be, for example, a trivalent element such as boron or aluminum.

Referring now to FIG. 3, the solar cell 10 includes a plurality of first-conductivity-type electrodes 12 and a plurality of second-conductivity-type electrodes 13 on the back face 11b of the semiconductor substrate 11. The first- and second-conductivity-type electrodes 12 and 13 are provided like strips extending in a perpendicular direction Y that will be detailed later.

The first- and second-conductivity-type electrodes 12 and 13 are electrically connected to impurity-diffused regions of different conductivity types and have different polarities. For example, the first conductivity type may be either p-type or n-type. It is assumed in the present embodiment that the first conductivity type refers to n-type, whereas the second conductivity type refers to p-type. Accordingly, the first-conductivity-type electrodes 12 may be referred to as the n-electrodes 12, and the second-conductivity-type electrodes 13 as the p-electrodes 13, in the following description.

The n-electrodes (first-conductivity-type electrodes) 12 are in contact with, and electrically connected to, the n-type-impurity-diffused regions 15. The p-electrodes (second-conductivity-type electrodes) 13 are in contact with, and electrically connected to, the p-type-impurity-diffused regions 16. The n- and p-electrodes 12 and 13 are disposed alternately at suitable intervals.

The n- and p-electrodes 12 and 13 may be made of a conductive material including a metal such as silver or aluminum. The n- and p-electrodes 12 and 13 extend linearly substantially like strips on the back face of the solar cell 10 in a prescribed direction. The n- and p-electrodes 12 and 13 are not necessarily shaped like strips and may be each divided and shaped like a plurality of rectangles or dots so long as electrodes for each conductivity type are disposed side by side in a prescribed direction.

As an alternative, the profile of each electrode may be partly irregular, slanting, or curved. The electrode may be provided in a partially missing pattern with openings. As a further alternative, the n-electrodes 12 may be mutually connected so long as they are for a single conductivity type, and the same applies to the p-electrodes 13. Further alternatives are also possible so long as those n- and p-electrodes 12 and 13 on the back face 11b of the semiconductor substrate 11 of each solar cell 10 are insulated from each other and not connected electrically to common wires on the wiring sheet 20 (details about the wiring sheet 20 will be given later).

For convenience of description, each drawing schematically shows a total of 11 n- and p-electrodes 12 and 13 provided side by side alternately in a direction that intersects their length as an example. The number of actual n- and p-electrodes 12 and 13 may be altered to any number. In addition, the n- and p-electrodes 12 and 13 are not necessarily provided alternately side by side. The number and arrangement may be altered in a suitable manner in accordance with the design of the solar cells 10 the wiring sheet 20.

Referring to FIG. 4, the solar cell 10 may have, for example, texture or a like irregular structure formed on the front face 11a of the semiconductor substrate 11 as an antireflective structure that restricts reflection of light. The solar cell 10 may further include, on the irregular structure, an antireflective film 17 that has such physical properties as to restrict reflection of light.

The back face 11b of the semiconductor substrate 11 of the solar cell 10 may have a passivation layer (interface passivation layer) 18 formed thereon. The passivation layer 18 provides protection for defects on the back face 11b of the semiconductor substrate 11 and restrains carrier recombination in the presence of defects, which improves power generation capacity. The passivation layer 18 has openings (contact holes) for the n- and p-type-impurity-diffused regions 15 and 16. The n-electrodes 12 and the p-electrodes 13 are respectively in contact with, and electrically connected to, the n-type-impurity-diffused regions 15 and the p-type-impurity-diffused regions 16 through the openings.

The backside-electrode-based solar cell that can be used in the present invention may be the back-contacted solar cell described above in which both the n-type-impurity-diffused regions 15 and the p-type-impurity-diffused regions 16 are provided on the back face 11b of the semiconductor substrate 11 to form p-n junctions, with no electrodes provided on the front face (light-receiving face) 11a. Alternatively, the solar cell may be an MWT (metal wrap through) cell or ae EWT (emitter wrap through) cell. In an MWT cell, the n- and p-type-impurity-diffused regions are provided respectively on the light-receiving face and on the back face, and the first-conductivity-type electrodes on the light-receiving face run through the semiconductor substrate to reach the back face so that the first- and second-conductivity-type electrodes can be connected to wires on the back face. In an EWT cell, the impurity-diffused regions on the light-receiving face run through the substrate to reach the back face so that both the first- and second-conductivity-type electrodes can be provided on the back face. In other words, the present invention is applicable to solar cells that are structured such that electrodes of different polarities are provided on the back face of the semiconductor substrate.

Wiring Sheet

Referring to FIGS. 1 to 5, the wiring sheet 20 includes a base member 21 on which there are provided wires 22. The wires 22 electrically connect in series the n- and p-electrodes 12 and 13 of the solar cells 10 which are, as described earlier, disposed side by side in the cell array direction X (direction from the far left to the near right in FIG. 3 and the left/right direction in FIG. 5).

The base member 21 is a substrate made of, for example, an insulating resin such as polyester, polyethylene naphthalate, polyethylene terephthalate, or polyimide. The wires 22 are, for example, copper-based, strip-shaped conductive wires (ribbon wires), rectangular wires, or copper foil wires. The wires 22 may have other compositions or structures. Examples of alternative materials include highly conductive metals such as copper, gold, silver, aluminum, and nickel and alloys and stacks of some or all of these metals. Examples of alternative structures include ordinary lead wires and a planar and a wire-like pattern formed by directly applying raw material paste for electrodes onto the base member by inkjet technology.

In the present embodiment, the wiring pattern that will be described later in detail is formed by attaching a plurality of first wires 22*a* and a plurality of second wires 22*b* onto the front face of the base member 21 using an adhesive 23. Consequently, the first wires 22*a* are partially buried in the adhesive 23 on the base member 21 as shown in the bottom of FIG. 2, so that the first wires 22*a* are in contact with the adhesive 23 not only on their bottom faces, but also on parts of their side faces. The same description applies to the second wires 22*b*.

Figure 5:
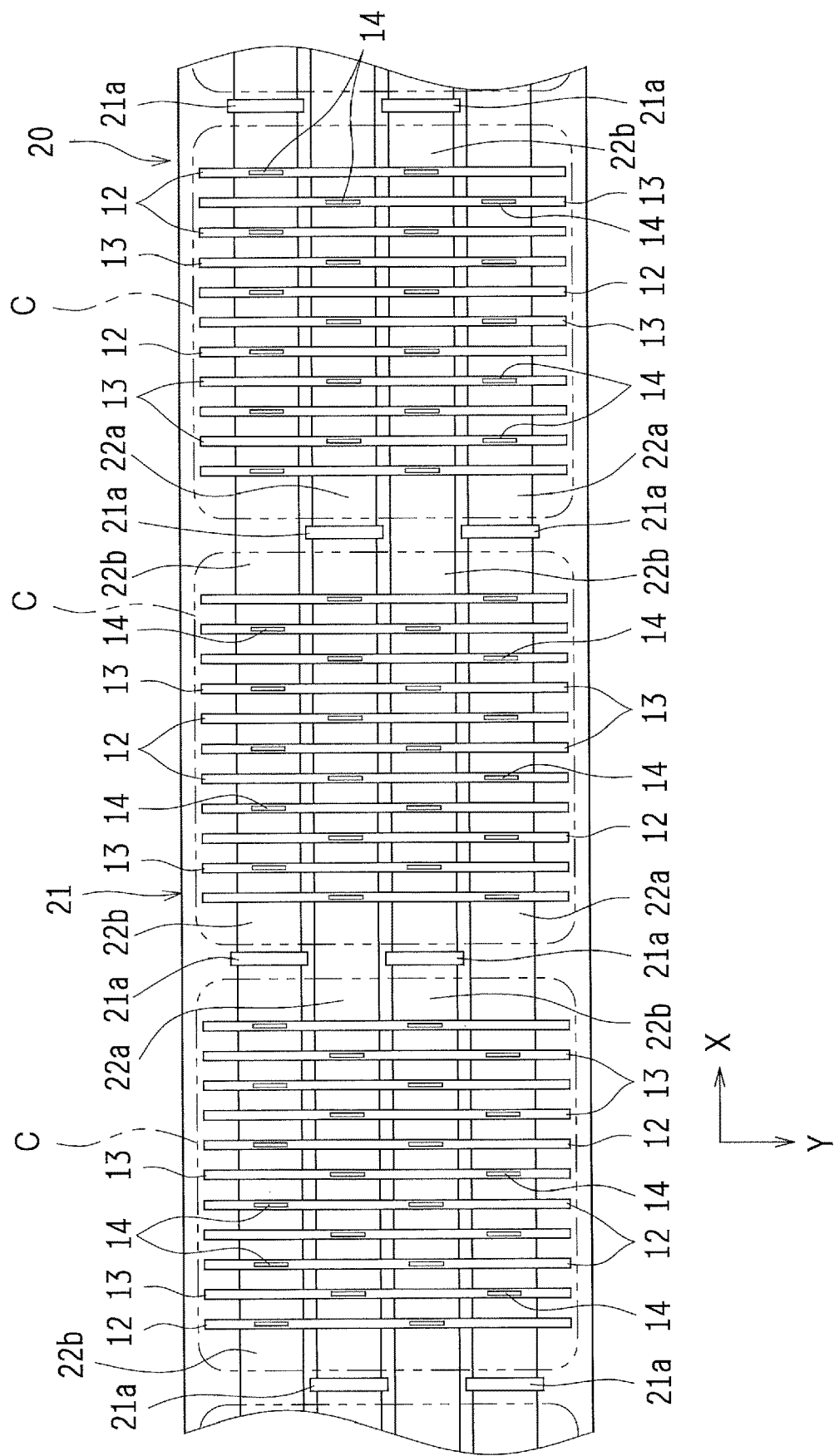
FIG. 5 is a schematic plan view of the relative positions of the backside electrodes of the solar cell and the metal wires on the wiring sheet connected to the backside electrodes.

For convenience of description, the first wires 22*a* and the second wires 22*b*, provided alternately side by side, constitute a total of four parallel wires 22 in the present embodiment. The number of the wires 22 may be equal to any number selected in accordance with the shape and size of the n- and p-electrodes 12 and 13 of the solar cells 10 and also in accordance with how the wires 22 are connected to the n- and p-electrodes 12 and 13. FIG. 3 shows one of the solar cells 10 being detached from the wiring sheet 20, schematically representing the relative positions of the n- and p-electrodes 12 and 13 and the wires 22 on the wiring sheet 20 connected to the n- and p-electrodes 12 and 13. FIG. 5 is a transparent view of the wiring sheet 20 as observed from its front face (from above in FIG. 1).

Referring to FIGS. 3 and 5, the wires 22 on the wiring sheet 20 have such a pattern in which the first and second wires 22*a* and 22*b*, shaped like narrow strips extending in the cell array direction X, are disposed side by side in a direction that intersects the cell array direction X (this particular direction is the up/down direction in FIG. 5 and will be referred to as the perpendicular direction Y in the following description). The first wires 22*a* straddle two solar cells 10 that are adjacent in the cell array direction X so as to connect these two solar cells 10. The first wires 22*a* and the second wires 22*b* are not necessarily shaped like perfect strips so long as they extend along a straight line and may be partially bent, altered in width, or otherwise slightly modified in shape.

Referring to FIGS. 3 and 5, each solar cell 10 in the present embodiment is disposed such that the n- and p-electrodes 12 and 13 thereof extend in the perpendicular direction Y. Meanwhile, since the first wires 22*a* and the second wires 22*b* extend in the cell array direction X, the wires 22 on the wiring sheet 20 cross the n-electrodes 12 and the p-electrodes 13 of the solar cells 10 (at substantially right angles).

As shown in FIG. 5, each first wire 22*a* straddling two adjacent solar cells 10 has a portion thereof toward one side in terms of the cell array direction X (e.g., toward the left side in FIG. 5) connected to the p-electrodes 13 of one of the two solar cells 10 located on the left side in FIG. 5 by a junction material 14 such as a Ag paste or solder and similarly has a portion thereof toward the other side in terms of the cell array direction X (e.g., toward the right side in FIG. 5) connected to the n-electrodes 12 of the solar cell 10 located at the center of FIG. 5 by the junction material 14.

In other words, for example, in one of the solar cells ("first solar cell") 10 that is located in the central one of areas C in terms of the left/right direction in FIG. 5 (FIG. 5 shows no solar cells 10, but corresponding areas C), one of the first wires 22*a* (e.g., the second one of the wires 22 in FIG. 5 as counted from the top thereof) connects the n-electrodes 12 of the first solar cell 10 to the p-electrodes 13 of another one of the solar cells ("second solar cell") 10 that is adjacent thereto toward one side in terms of the cell array direction X (e.g., toward the left side), whereas one of the second wires 22*b* (e.g., the third one of the wires 22 in FIG. 5 as counted from the top thereof) connects the p-electrodes 13 of the first solar cell 10 to the n-electrodes 12 of a further one of the solar cells ("third solar cell") 10 that is adjacent thereto toward the other side in terms of the cell array direction X (e.g., toward the right side).

The wires 22 (first and second wires 22*a* and 22*b*) on the wiring sheet 20 thus connect the electrodes of different polarities on the back faces of the solar cells 10 adjacent in terms of the cell array direction. This arrangement is repeated in the cell array direction X to connect the solar cells 10 electrically in series. Where there is provided no junction material 14, the n- and p-electrodes 12 and 13 of the solar cells 10 may cross the wires 22 on the wiring sheet 20, but are electrically insulated from the wires 22 by the intervening adhesive 30.

The electric insulation is not necessarily maintained by the adhesive 30 and may be achieved by an insulating cover member provided between the electrodes and the wires where the electrodes should not be connected to the wires. The cover member only needs to cover either the electrodes or the wires. The junction material 14 may be omitted if the cover member is used and the adhesive 30 can fix the solar cells 10 and the wiring sheet 20 while maintaining adequately intimate contact of the electrodes and wires. Conversely, if the junction material 14 alone can provide reliable and adequate fixing strength, the adhesive 30 may be omitted.

Referring to FIG. 5, there are provided rectangular holes 21*a* between the second wires 22*b* of the first solar cell and the second wires 22*b* of the second solar cell. The holes 21*a* run through the base member 21 and the second wires 22*b*. As will be described in detail below, the base member 21 and the second wires 22*b* are partially removed together in the present embodiment to provide the holes 21*a*. The second wires 22*b*, as being divided by the holes 21*a*, have end portions thereof located on the peripheral rims of the holes 21*a*.

In other words, the second wire 22*b* that is connected to the p-electrodes 13 of the first solar cell and the second wire 22*b* that is connected to the n-electrodes 12 of the second solar cell are disposed end to end along a straight line extending in the cell array direction X. These second wires 22*b* are separated by the holes 21*a* running through the base member 21 and the second wires 22*b*.

Still referring to FIG. 5, there are similarly provided rectangular holes 21*a* between the first wires 22*a* of the first solar cell and the first wires 22*a* of the third solar cell. These holes 21*a* run through the base member 21 and the first wires 22*a*. In other words, the first wire 22*a* that is connected to the n-electrodes 12 of the first solar cell and the first wire 22*a* that is connected to the p-electrodes 13 of the third solar cell are disposed end to end along a straight line extending in the cell array direction X. These first wires 22*a* are separated by the holes 21*a* running through the base member 21 and the first wires 22*a*.

Figure 6:
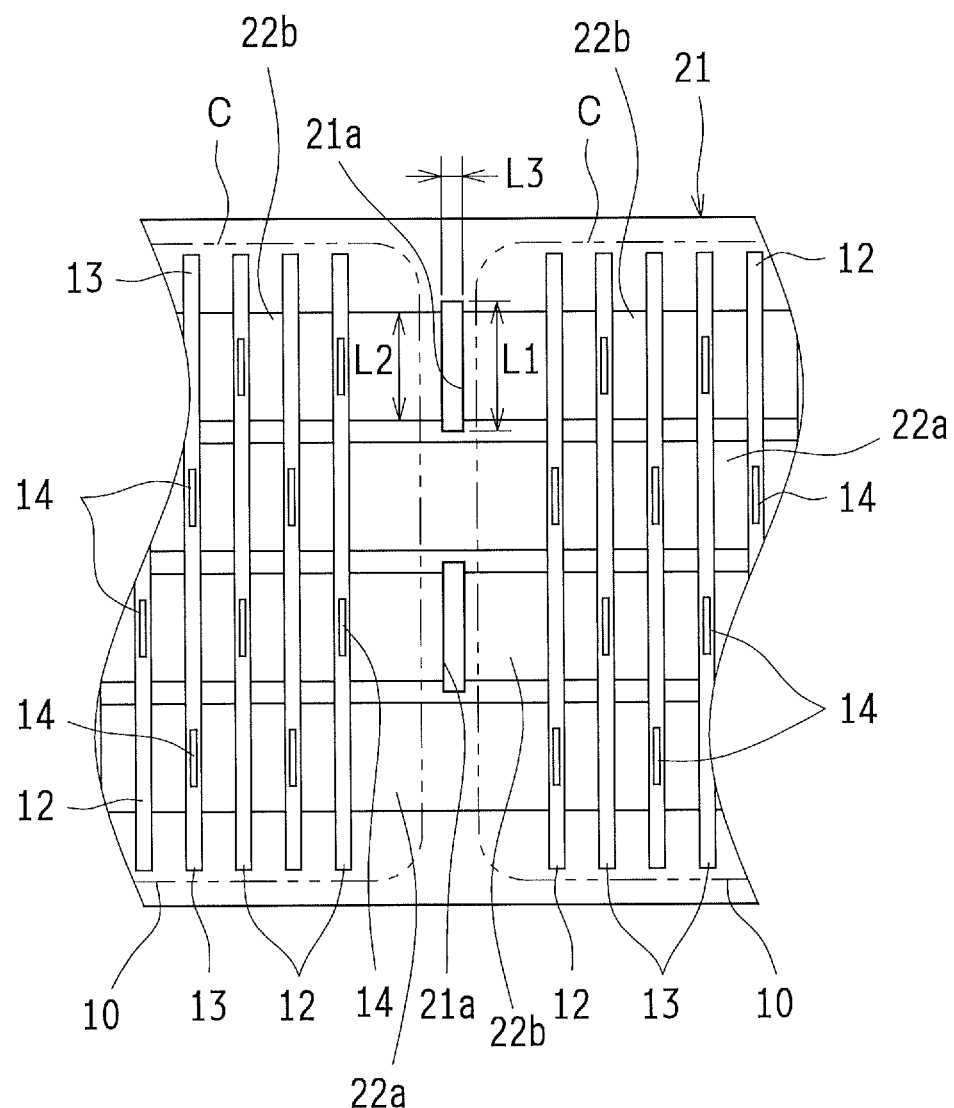
FIG. 6 is an enlarged view of a space between adjacent solar cells, illustrating electrode lines being separated by holes.

As shown enlarged in FIG. 6, the hole 21*a* has length L1 in the perpendicular direction Y, whereas the second wire 22*b* has width L2 (i.e., length in the perpendicular direction Y). Length L1 is specified to be larger than width L2, to more reliably separate the wires 22 from each other.

Still referring to FIG. 6, the holes 21*a* in the present embodiment are located only in the parts of the wiring sheet 20 where no solar cells 10 are provided (i.e., outside the areas C). If, for example, the ends of the second wires 22*b* are displaced in the opposite direction from the direction indicated by arrow X in FIG. 6 (toward the left side in FIG. 5) due to a positional deviation during the formation of the holes 21*a*, this structure still provides a sufficient distance from the connection points to the n-electrodes 12 of the left-side, second solar cell 10, thereby reducing the chances of connection problems. In other words, the holes 21a do not need to be aligned strictly in placing the solar cells 10 over the wiring sheet 20. The structure thereby reduces, for example, the defects arising from positional deviations and the need for repositioning of the solar cells 10.

The holes 21a in the present embodiment may be located where no solar cells 10 are provided. Specifically, the hole 21a has length L3 in the cell array direction X that is smaller than the distance that separates adjacent solar cells 10. This structure, as described above, prevents the holes 21a from extending into the areas C where the solar cells 10 will be provided and eliminates the need for increasing the distance that separates the solar cells 10 that are disposed side by side in the cell array direction X. The structure thereby ensures the footprint of the solar cells 10, that is, the light-receiving area of the solar cells 10, without adding to the area of the solar cell module 100. That in turn improves power generation efficiency per unit area.

The encapsulant 60 is provided on the light-receiving face of the solar cells 10 and the back face of the wiring sheet 20, sandwiching the wiring sheet 20 on which the solar cells 10 are provided. The transparent substrate 40 is further placed on the encapsulant 60 on the light-receiving face, and the back-face-protection member 50 is further placed on the encapsulant 60 on the back face. The encapsulant 60 is a thermoplastic resin such as ethylene vinyl acetate (EVA) resin.

The members are heated as they are stacked in this manner. Due to this heating, the encapsulant 60, being a thermoplastic resin, temporarily softens and then cools, until the encapsulant 60 cures. This process integrates the transparent substrate 40, the solar cells 10, the wiring sheet 20, and the back-face-protection member 50 into a single piece in the solar cell module 100 as shown in FIG. 1.

Some of the encapsulant 60, which softens in the heating process, enters the holes 21a in the wiring sheet 20, so that the encapsulant 60 on the light-receiving face and the encapsulant 60 on the back face move through the holes 21a and join together vertically before curing. The thermoplastic resin used as the encapsulant 60 has poor adhesion to the metal used as the wires 22 such as copper. The encapsulant 60 easily comes off the wires 22 at their interface, creating gaps there, due to thermal and mechanical loads on the solar cell module 100. Water or another undesirable object may infiltrate the gaps, which could in turn lead to defects such as corrosion and short-circuiting.

The encapsulant 60 on the light-receiving face and the encapsulant 60 on the back face join through the holes 21a in the present embodiment. This structure increases adherence and thereby restrains the encapsulant 60 from coming off from the wires 22 at their interface. Hence, the present embodiment achieves the advantage of the solar cell module 100 having improved durability, reliability, and other related properties.

Method of Manufacturing Wiring Sheet

Next will be described an example method of manufacturing the wiring sheet 20 for use in the solar cell module 100 described above. In the present embodiment, a wiring pattern is formed on the wiring sheet 20 without relying on conventionally commonly used photolithography. For this purpose, first, copper foil wires (wiring material) to be fabricated into the wires 22 are provided on the base member 21 of the wiring sheet 20 (wiring material provision step).

These copper foil wires are, for example, rectangular wires obtained by rolling copper wires. Alternatively, ribbon wires, which are available in strips and require no rolling, may be used as the copper foil wires. Metal wires may be disposed as they are on the base member 21 as the wires 22. As a further alternative, broad copper foil wires may be sliced parallelly to obtain strip-shaped wires. The following description of the present embodiment will assume, as an example, that ribbon wires, which are available in strips, are attached to the base member 21 parallelly.

As shown schematically in FIGS. 7(a) and 7(b), the base member 21 and the wires (copper foil wires) 22 are wound respectively around rolls 31 and 32. The base member 21 has a thermoplastic adhesive material layer formed thereon in advance. The wires 22 are already worked on to have a predetermined width. The base member 21 and the wires 22 are rolled out of the rolls 31 and 32 respectively and stacked and passed between a pair of heated pressure rollers 33. The wires 22 are passed through a guide 34 that has such a plurality of grooves that the wires 22 can be separated by predetermined distances from each other before being passed between the pressure rollers 33.

The adhesive 23, which melts with heat, is applied in advance onto the base member 21 to form an adhesive material layer. The adhesive melts when the base member 21 is passed between the pressure rollers 33. Thereafter, as the temperature falls, the adhesive cures to fixedly attach the wires 22 onto the base member 21.

The adhesive 23 is provided between the base member 21 and the wires 22 (22a) in this manner as shown in FIG. 2. The wires 22 (first wires 22a in FIG. 2) are partially buried in the adhesive 23, so that at least a part of each side face of the wires 22 can adhere to the adhesive 23. The partial adhesion of the side faces of the wires 22 to the adhesive 23 increases the fixing strength of the wires 22 to the wiring sheet 20.

This description gives an example where the wires (copper foil wires) 22 are fixedly attached by melting the solid thermoplastic adhesive 23 with heat. There are other possibilities for the adhesive 23. One of such alternatives is an adhesive that has adhesiveness at all times regardless of temperature, like double-sided tape. This adhesive can be used for fixing without heating. A protective film should be provided on the adhesive and removed before being passed between the pressure rollers 33.

An intermediate product for the wiring sheet 20 is obtained in this manner. The intermediate product extends contiguously over the length of the base member 21 (i.e., in the cell array direction) and has a plurality of copper foil wires fixedly attached thereon at prescribed intervals. The holes 21a are formed by punching out the base member 21 and the copper foil wires in prescribed locations using metal dies (not shown) when the intermediate product is cut into prescribed lengths that fit the solar cell module 100 in size (removing step).

This description gives an example where the holes 21a are formed by punching out the base member 21 and the copper foil wires using metal dies after placing and fixedly attaching the wires 22 onto the base member 21 of the wiring sheet 20. The holes 21a may be formed by other methods. As an example, the base member 21 and the wires 22 may be removed by laser to form the holes 21a in any shape. Alternatively, both the base member 21 and the wires 22 may be cut using a cutter to form the holes 21a.

The adhesive 30 is applied onto the wiring sheet 20 prepared in this manner or onto the back faces of the solar cells 10. After that, the solar cells 10 are fixedly attached side by side as shown in FIG. 3. The space between the transparent substrate 40 and the back-face-protection member 50 is then sealed with the encapsulant 60 to obtain the solar cell module 100 shown in FIGS. 1 and 2. This last step of the manufacture of the solar cell module 100 is well-known, and description thereof is omitted.

As described earlier, in the solar cell module 100 in accordance with the present embodiment, the wires 22, extending in the cell array direction X of the wiring sheet 20, are disposed side by side in the perpendicular direction Y, so as to connect, alternately in the perpendicular direction Y, each solar cell 10 to another solar cell 10 that is adjacent thereto on one side or another in terms of the cell array direction X. Since these wires 22 are connected to electrodes of different polarities of each pair of adjacent solar cells 10, all the solar cells 10 disposed side by side in the cell array direction X are electrically connected in series.

The wires 22 are disposed straddling every two solar cells 10 that are adjacent in the cell array direction X to connect these solar cells 10. This is a simple wiring pattern. In addition, each wire 22 is separated, by the holes 21a that run through both the base member 21 and the wire 22, into the first wires 22a and the second wires 22b that are adjacent in the cell array direction X and that need to be electrically separated in the wiring pattern. To form the holes 21a, one only needs to physically remove the base member 21 and the wires 22 as described earlier.

To put it differently, one only needs to remove those parts of the base member 21 and the wires 22 which correspond to the holes 21a to form the wires 22 in the pattern described above on the base member 21 of the wiring sheet 20. This arrangement allows the aforementioned single removing step to replace a plurality of steps of masking, exposure to light, development, etching, and removal of the mask that are generally required in photolithography to form a conventional wiring pattern. That in turn reduces process time and energy needed to manufacture wiring sheets, which leads to a lower production cost of the wiring sheet. The steps of development, etching, and mask removal in many cases involve processing in chemical solutions. Eliminating these steps reduces environmental impact.

Embodiment 2

The following will describe another embodiment of the present invention. For convenience of description, members of the present embodiment that have the same function as members of Embodiment 1 are indicated by the same reference numerals, and description thereof is omitted.

Figure 8:
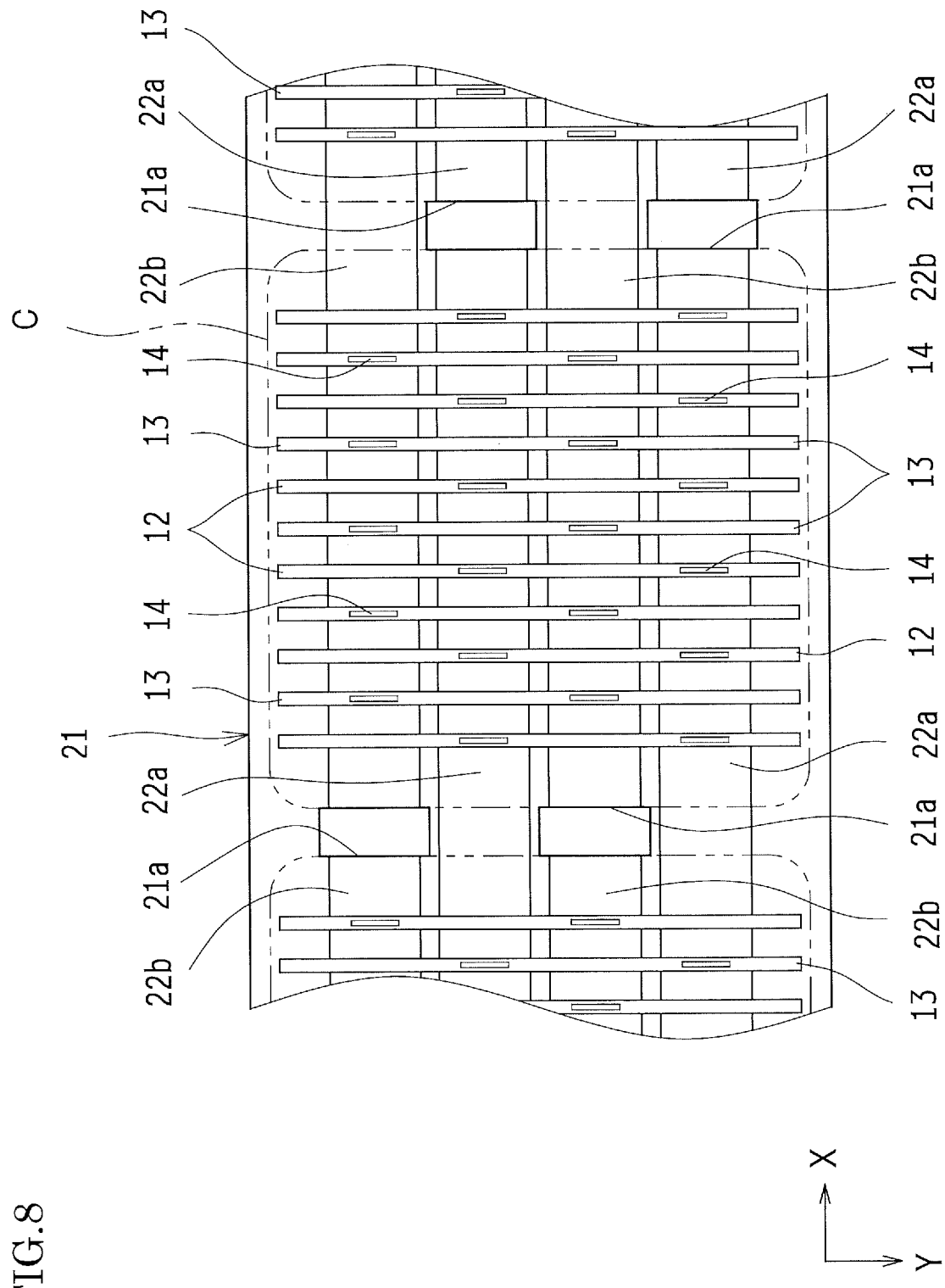
FIG. 8 is a schematic plan view of a solar cell module and wiring sheet in accordance with Embodiment 2 of the present invention.

FIG. 8 is an illustration of a solar cell module 100 and a wiring sheet 20 in accordance with Embodiment 2. As show in FIG. 8, in the wiring sheet 20 in accordance with the present embodiment, each hole 21a, separating two second wires 22b that are adjacent in the cell array direction X, has a peripheral rim thereof located on the perimeters of areas C of the base member 21 in which there will be provided solar cells 10.

Specifically, similarly to the hole 21a in Embodiment 1, the hole 21a in Embodiment 2 is a rectangle that is longer in the perpendicular direction Y than in the cell array direction X and has a length in the perpendicular direction Y that is larger than the width of the first wires 22a and the second wires 22b. The hole 21a has a length in the cell array direction X that is substantially equal to the interval of the areas C where the solar cells 10 will be provided. The peripheral rim of the hole 21a, on both sides thereof in terms of the cell array direction X, is located on the perimeter of an area C where there will be provided a solar cell 10.

In this structure where the peripheral rims of the holes 21a in the base member 21 are located on the perimeters of the areas C where the solar cells 10 will be provided, a positional deviation of any one of the solar cells 10 from a corresponding area C can be visually spotted when the solar cells 10 are fixedly attached side by side onto the wiring sheet 20 as detailed earlier in reference to FIG. 3, because such a deviation causes the peripheral rim of that deviating solar cell 10 to cover a part of a hole 21a.

Embodiment 3

Figure 9:
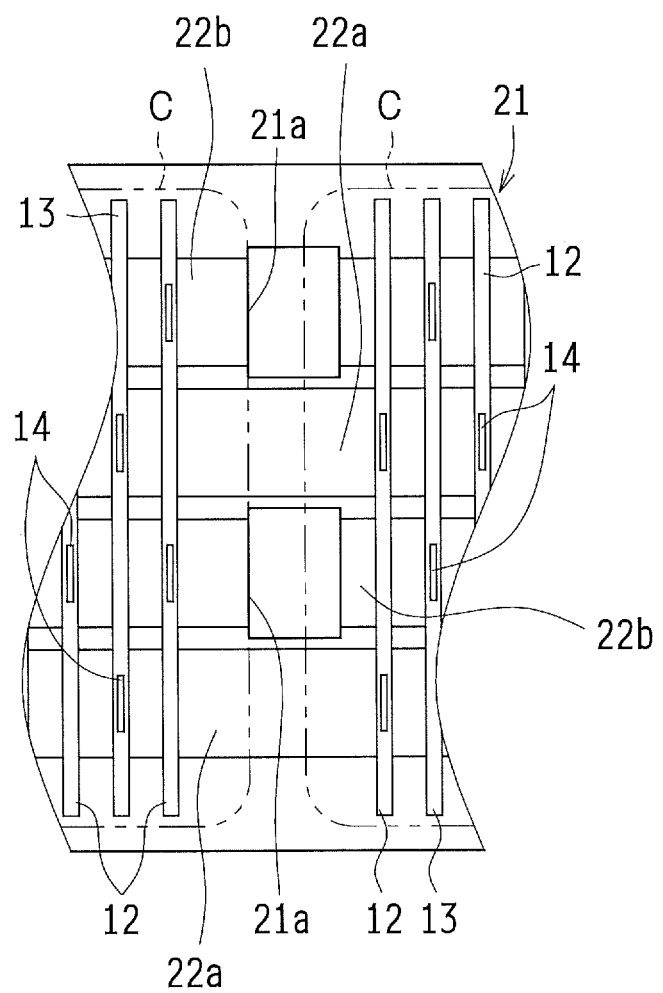
FIG. 9 is a schematic plan view of a solar cell module and wiring sheet in accordance with Embodiment 3 of the present invention.

FIG. 9 is an illustration of a solar cell module 100 and a wiring sheet 20 in accordance with Embodiment 3. As shown in FIG. 9, in the wiring sheet 20 in accordance with the present embodiment, each hole 21a is provided partially overlapping an area C where there will be provided a solar cell 10. Specifically, similarly to the hole 21a in Embodiments 1 and 2, the hole 21a in Embodiment 3 is a rectangle that, in a plan view thereof, is longer in the perpendicular direction Y than in the cell array direction X and has a length in the perpendicular direction Y that is larger than the width of the second wires 22b.

Unlike Embodiments 1 and 2, however, the length of the hole 21a in the cell array direction X is larger than the interval of the areas C where the solar cells 10 will be provided. The peripheral rim of the hole 21a is located on the perimeter of an area C on either one of the two sides of the hole 21a in terms of the cell array direction X (i.e., on the left side in FIG. 9). In contrast, on the other side (i.e., on the right side in FIG. 9), the hole 21a extends beyond the perimeter of another area C and into the area C. This structure is possible because the n-electrodes 12 are the closest electrodes to the hole 21a in the right-side solar cell 10 and are not connected to the second wires 22b.

When there are no electrode/wire connection points in proximity to the hole 21a, the hole 21a can be extended in the cell array direction X in this manner and punched out using metal dies that are not excessively small, which is advantageous in ensuring the durability of the metal dies themselves.

Embodiment 4

Figure 10:
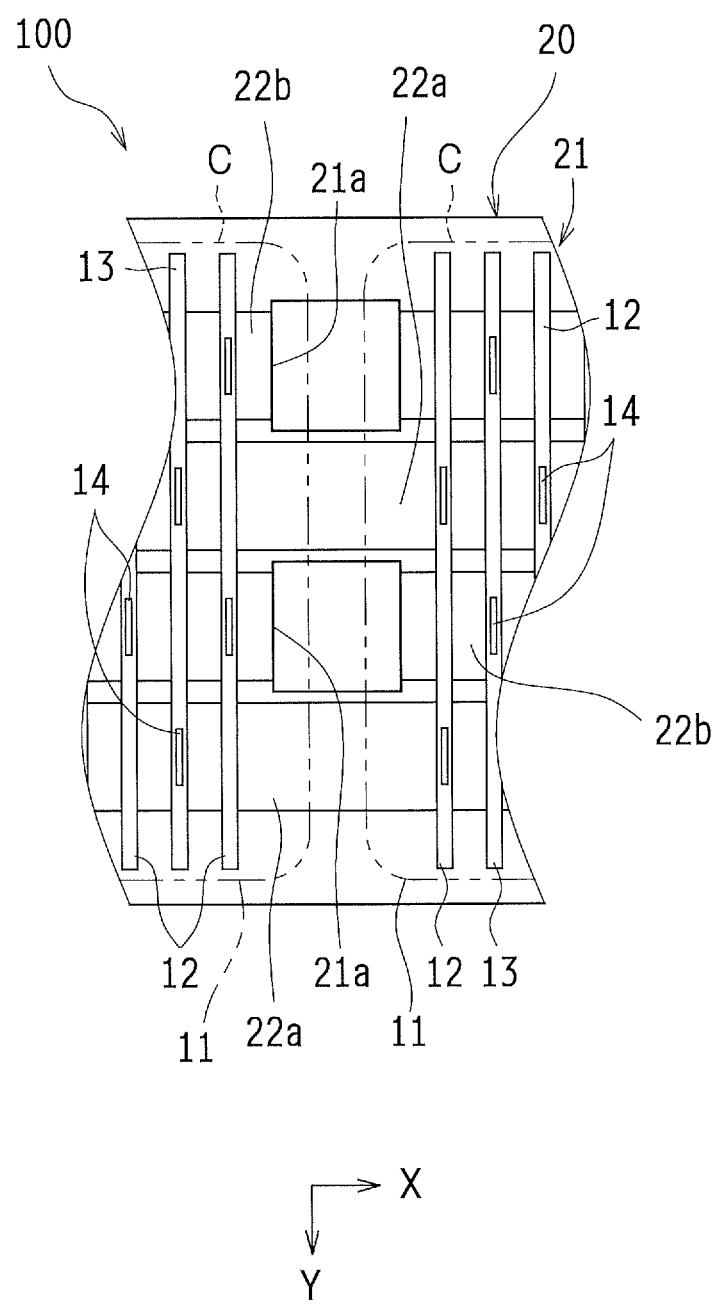
FIG. 10 is a schematic plan view of a solar cell module and wiring sheet in accordance with Embodiment 4 of the present invention.

FIG. 10 is an illustration of a solar cell module 100 and a wiring sheet 20 in accordance with Embodiment 4. In the wiring sheet 20 in accordance with the present embodiment, each hole 21a is provided partially in an area C where there will be provided a solar cell 10 on both sides of the hole 21a in terms of the cell array direction X. Specifically, similarly to the hole 21a in Embodiments 1 and 2, the hole 21a in Embodiment 4 is a rectangle that is longer in the perpendicular direction Y than in the cell array direction X and has a length in the perpendicular direction Y that is larger than the width of the second wires 22b.

Similarly to Embodiment 3, the hole 21a has a length in the cell array direction X that is larger than the interval of the areas C where the solar cells 10 will be provided. As shown in FIG. 10, the hole 21a extends beyond the perimeter of the area C and into the area C on both sides of the hole 21a in terms of the cell array direction X.

The solar cell 10 has its electrodes separated by a proper distance from the edge of the semiconductor substrate 11 in proximity to the hole 21a. These holes 21a, extended further in the cell array direction X, further improve tolerance to positional deviations, so long as the holes 21a certainly do not reach the electrode/wire connection points even in the presence of a positional deviation. The extended holes 21a are more advantageous in ensuring the durability of the metal dies used to punch out the holes 21a.

Embodiment 5

Figure 11A:
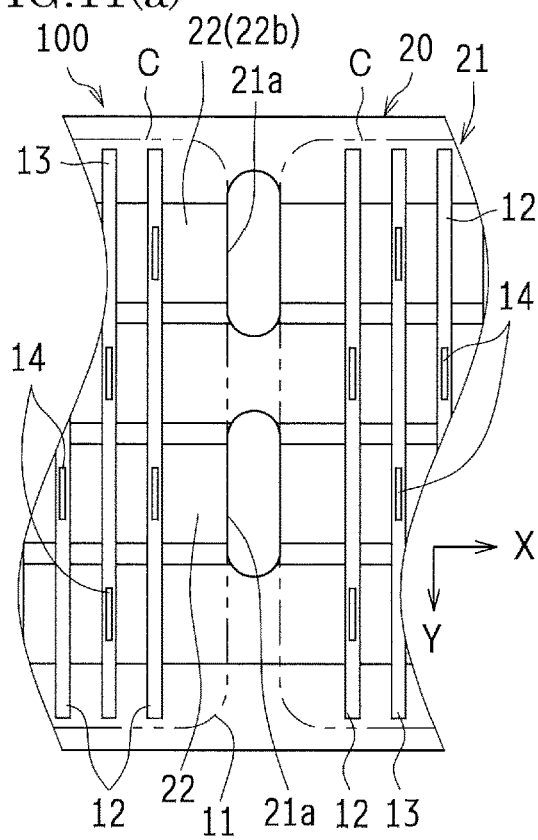
FIGS. 11(a) to 11(d) are schematic plan views of a solar cell module and wiring sheet in accordance with Embodiment 5 of the present invention.

FIGS. 11(a) to 11(d) are illustrations of a solar cell module 100 and a wiring sheet 20 in accordance with Embodiment 5. In the wiring sheet 20 in accordance with the present embodiment, each hole 21a has an oval shape, for example, as shown in FIG. 11(a). The hole 21a may alternately have an elliptical shape (not shown). The hole 21a preferably has a larger width than the wires 22 (e.g., the second wires 22b) in these cases as it does in the previous cases.

Figure 11B:
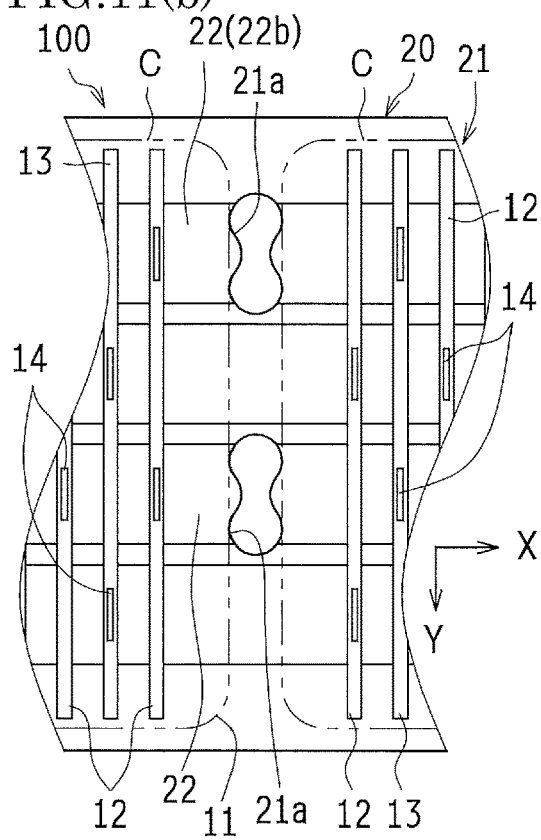
Figure 11C:
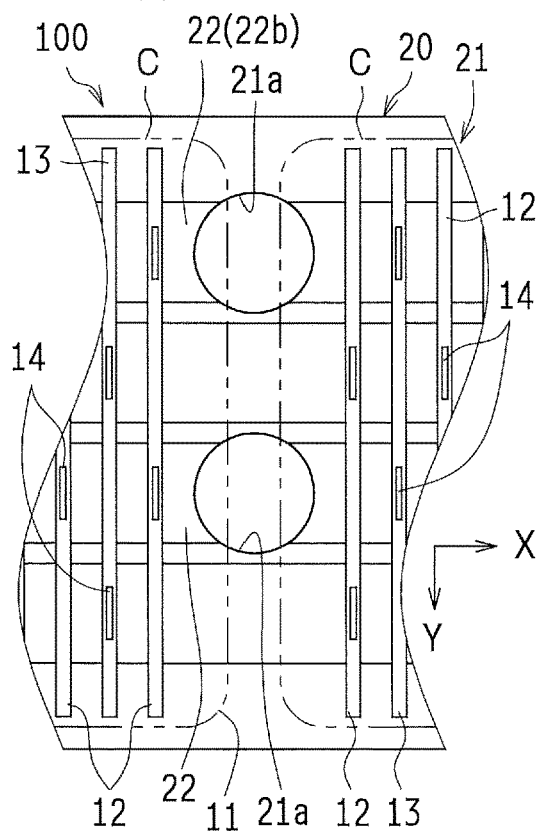

Alternatively, the hole 21a may be shaped like two partially connected circles as shown in FIG. 11(b) and may be circular as shown in FIG. 11(c). These profiles of the hole 21a are made up of continuous lines with no corners, such as curves and straight lines. The profiles have an advantage that the base member 21 is unlikely to develop cracks starting at corners.

Figure 11D:
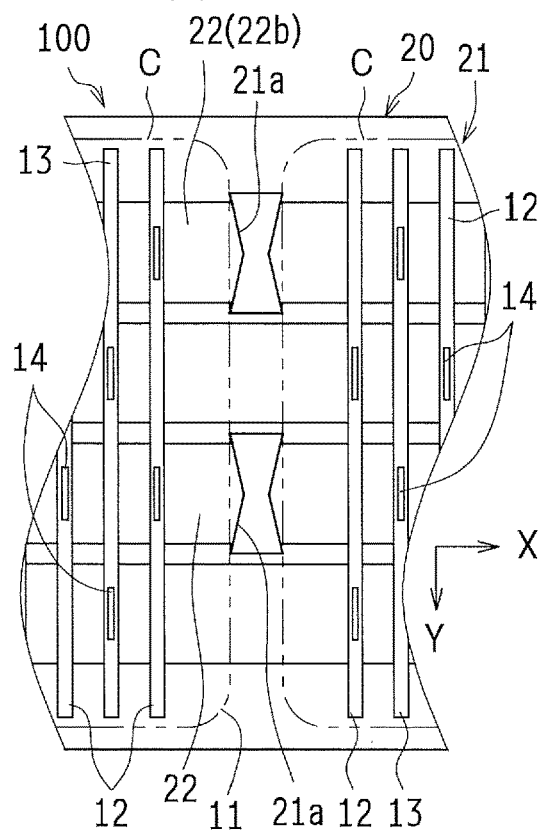

Alternatively, the hole 21a may be shaped like two partially connected wedges as shown in FIG. 11(d). With the hole 21a having such a shape, all the corners on the wires 22 separated by the holes 21a are larger than 90°, and there are no sharp corners formed. Therefore, the shape restrains the wires 22 from coming off starting at a corner.

Embodiment 6

Figure 12:
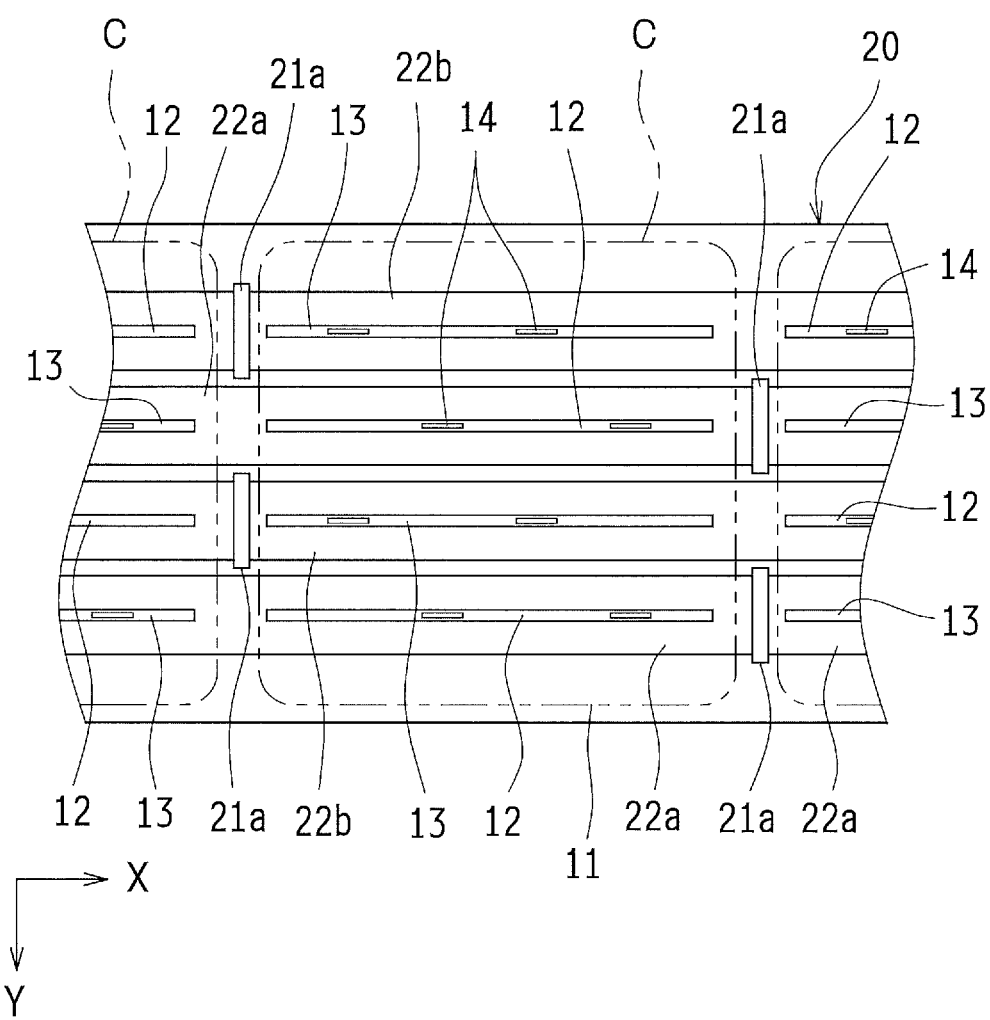
FIG. 12 is a schematic plan view of a solar cell module and wiring sheet in accordance with Embodiment 6 of the present invention.

FIG. 12 is a partial plan view of a solar cell module 100 in accordance with Embodiment 6. In Embodiment 1 and other embodiments, the electrodes 12 and 13 are aligned in a direction that intersects the length of the wiring sheet 20. In the solar cell module 100 in accordance with the present embodiment, the electrodes 12 and 13 are disposed to extend in the cell array direction X which is parallel to the wires 22 (first and second wires 22a and 22b) on the wiring sheet 20.

Since the electrodes 12 and 13 extend in the same direction as do the wires 22 on the wiring sheet 20 in this embodiment, those wires 22 and electrodes 12 and 13 which have different polarities do not cross if the electrodes 12 and 13 have a particular shape. Therefore, the adhesive 30 may be used in reduced amounts for insulation purposes. If a conductive adhesive can deliver sufficient fixing strength, the adhesive 30 may no longer be used at all.

In the solar cell 10 in the present invention, the electrodes 12 and 13 are not necessarily shaped like strips and disposed parallelly on the back face 11b of the semiconductor substrate 11 as described earlier. The electrodes 12 and 13 may have any structure so long as they can be connected to the wires 22.

Figure 13:
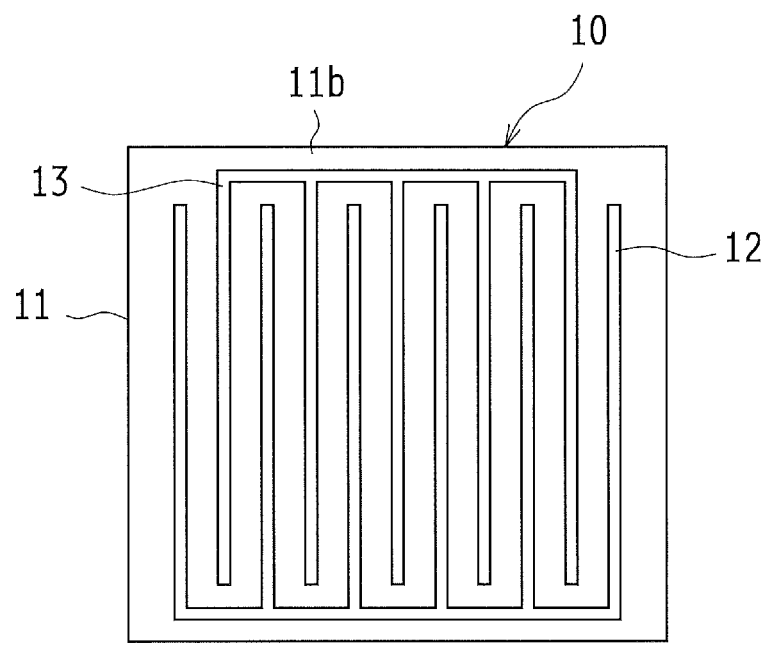
FIG. 13 is a schematic plan view of another form of the solar cell.

An example is shown in FIG. 13 where the n- and p-electrodes 12 and 13 are interdigitated (shaped like a comb) and arranged such that the teeth of the comb-shaped n-electrodes 12 and the teeth of the comb-shaped p-electrodes 13 alternate.

Figure 14:
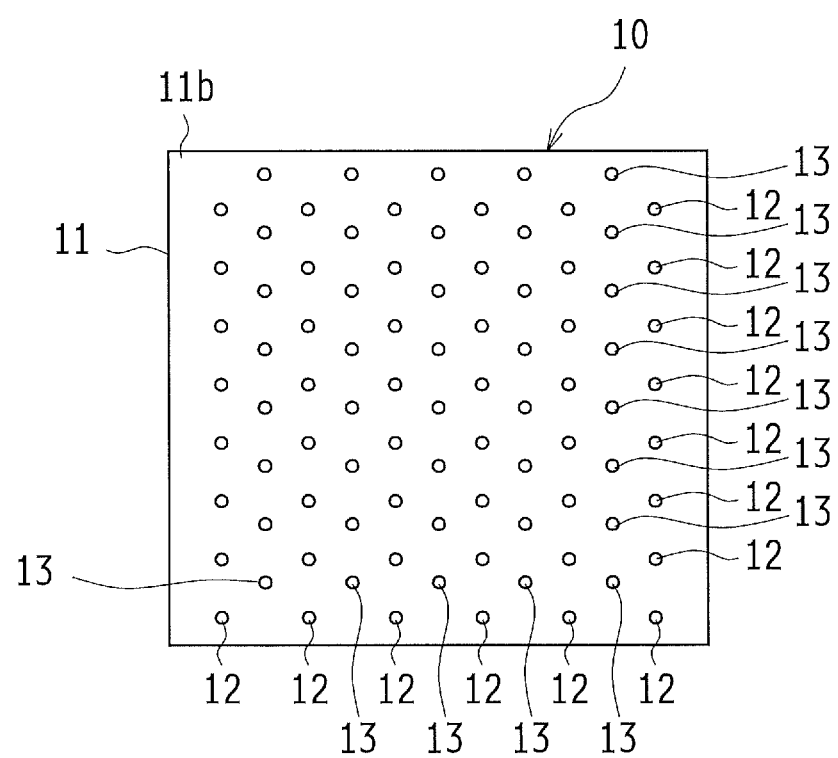
FIG. 14 is a schematic plan view of a further form of the solar cell.

Another example is shown in FIG. 14 where the n- and p-electrodes 12 and 13 are formed like dots, and rows of dot-shaped n-electrodes 12 and rows of dot-shaped p-electrodes 13 are arranged alternately at intervals in the up/down direction in FIG. 14.

A solar cell module (100) in accordance with the present invention includes: solar cells (10) each including first-conductivity-type electrodes (12) and second-conductivity-type electrodes (13) on one of faces of a semiconductor substrate (11); and a wiring sheet (20) including wires (22) on a base member (21), wherein: the solar cells include a first solar cell and a second solar cell that are disposed in a prescribed cell array direction (X) and that are electrically connected by the wires; and the wires are shaped like strips extending in the cell array direction and include first wires (22a) and second wires (22b) disposed side by side in a direction (Y) intersecting the cell array direction.

The first and second wires extend straddling the first and second solar cells. The first wires are connected to the first-conductivity-type electrodes of the first solar cell and to the second-conductivity-type electrodes of the second, adjacent solar cell. The second wires are connected to the second-conductivity-type electrodes of the first solar cell and to the first-conductivity-type electrodes of the second solar cell. The second wires are electrically separated by holes (21a) that extend through both the second wires and the insulating base member.

In this structure, first, a plurality of wires extending in a cell array direction of a wiring sheet straddles two adjacent solar cells to connect these solar cells. More specifically, the wires are disposed side by side in a direction intersecting the cell array direction, so as to connect, alternately in this direction, each solar cell to another solar cell that is adjacent thereto on one side or another in terms of the cell array direction. Hence, all the solar cells disposed side by side in the cell array direction are electrically connected in series.

In addition, every two wires that are adjacent in the cell array direction are separated by holes. These holes can be formed simply, for example, by punching out the wires and the base member using metal dies. In other words, the wires provided on the base member of the wiring sheet have such a wiring pattern that a plurality of wires is disposed straddling solar cells that are adjacent in the cell array direction to connect the solar cells, which requires no photolithographic process.

A wiring sheet (20) in accordance with the present invention is for use in the solar cell module (100) detailed above. The wires are shaped like strips extending in the cell array direction and include first wires (22a) and second wires (22b) disposed side by side in a direction (Y) intersecting the cell array direction.

The first and second wires extend straddling areas in which the first and second solar cells are to be disposed. The first wires are located so as to connect to the first-conductivity-type electrodes of the first solar cell and to the second-conductivity-type electrodes of the second, adjacent solar cell. The second wires are located so as to connect to the second-conductivity-type electrodes of the first solar cell and to the first-conductivity-type electrodes of the second solar cell. The second wires are electrically separated by holes (21a) that extend through both the second wires and the insulating base member.

A method of manufacturing a wiring sheet in accordance with the present invention is a method of manufacturing a wiring sheet for electrically connecting, using wires on an insulating base member, a plurality of solar cells each including first-conductivity-type electrodes and second-conductivity-type electrodes on one of faces of a semiconductor substrate. The method includes: the provision step of extending a plurality of wiring members constituting the wires in a direction in which the solar cells are to be disposed and disposing, on the insulating base member, the plurality of wiring members side by side in a direction intersecting the direction in which the plurality of wiring members is extended; and the removing step of removing the plurality of wiring members and the insulating base member so as to form holes through both the wires and the insulating base member.

In the wiring sheet 20 in accordance with each embodiment above, the base member 21 is provided with the rectangular holes 21a in order to separate the second wires 22b constituting some of the wires 22. Alternatively, for example, the holes 21a may be oval as shown in FIG. 11(a) or elliptical (not shown). In these alternative cases, preferably, the holes 21a, in a plan view thereof, are, for example, longer in the perpendicular direction Y than in the cell array direction X and has a length in the perpendicular direction Y that is larger than the width of the second wires 22b.

The present invention is not limited to the description of the embodiments above and may be altered within the scope of the claims. Embodiments based on a proper combination of technical means disclosed in different embodiments are encompassed in the technical scope of the present invention. Furthermore, a new technological feature may be created by combining different technological means disclosed in the embodiments.

The present invention may be implemented in various forms without departing from its spirit and main features. Therefore, the aforementioned examples are for illustrative purposes only in every respect and should not be subjected to any restrictive interpretations. The scope of the present invention is defined only by the claims and never bound by the specification. Those modifications and variations that may lead to equivalents of claimed elements are all included within the scope of the invention.

What is claimed is:

1. A solar cell module comprising:
   solar cells each including first-conductivity-type electrodes and second-conductivity-type electrodes on one of faces of a semiconductor substrate; and
   a wiring sheet including wires on an insulating base member,
   wherein:
   the solar cells comprise a first solar cell and a second solar cell that are disposed in a prescribed cell array direction and that are electrically connected by the wires;
   the wires include first wires and second wires parallelly disposed side by side in a direction intersecting the cell array direction;
   each of the first and second wires consists of an elongated rectangular shape and extends in the cell array direction so as to straddle the first and second solar cells;
   the first wires are connected to the first-conductivity-type electrodes of the first solar cell and to the second-conductivity-type electrodes of the second, adjacent solar cell;
   the second wires are connected to the second-conductivity-type electrodes of the first solar cell and to the first-conductivity-type electrodes of the second solar cell;
   through holes are provided in the insulating base member so as to penetrate between a front face and a back face of the insulating base member and also to penetrate the second wires on the insulating base member, and
   connecting parts of the second wires to the second-conductivity-type electrodes of the first solar cell are electrically separated from respective adjacent connecting parts of the second wires to the first-conductivity-type electrodes of the second solar cell by respective through holes extending through both the second wires and the insulating base member.

2. The solar cell module according to claim 1, wherein:
   the solar cells further comprise a third solar cell opposite the first solar cell from the second solar cell and adjacent to the first solar cell;
   the second wires are connected to the second-conductivity-type electrodes of the first solar cell and to the first-conductivity-type electrodes of the third solar cell;
   the first wires are connected to the first-conductivity-type electrodes of the first solar cell and to the second-conductivity-type electrodes of the third solar cell; and
   connecting parts of the first wires to the first-conductivity-type electrodes of the first solar cell are electrically separated from respective adjacent connecting parts of the first wires to the second-conductivity-type electrodes of the third solar cell by the respective through holes extending through both the first wires and the insulating base member.

3. The solar cell module according to claim 1, further comprising:
   an encapsulant sandwiching the solar cells and the wiring sheet;
   a transparent substrate on a solar-cell-side of the encapsulant; and
   a back-face-protection member on a wiring-sheet-side of the encapsulant,
   wherein the encapsulant is partially existent in the through holes.

4. A wiring sheet comprising:
   an insulating base member;
   wires provided on the insulating base member; and
   a plurality of cell-disposing areas on each of which a corresponding one of a plurality of solar cells is disposed, the plurality of solar cells each including first-conductivity-type electrodes and second-conductivity-type electrodes,
   wherein:
   the cell-disposing areas are arranged side by side on the insulating base member in a prescribed cell array direction;
   the wires include first wires and second wires parallelly disposed side by side in an orthogonal direction intersecting the cell array direction;
   each of the first and second wires consists of an elongated rectangular shape and extends in the cell array direction so as to straddle adjacent areas of the cell-disposing areas in the cell array direction;
   the first wires are located so as to connect to the first-conductivity-type electrodes of one solar cell and to the second-conductivity-type electrodes of the other solar cell out of an adjacent pair of the solar cells;
   the second wires are located so as to connect to the second-conductivity-type electrodes of the one solar cell and to the first-conductivity-type electrodes of the other solar cell;
   through holes are provided in the insulating base member so as to penetrate between a front face and a back face of the insulating base member and also to penetrate the second wires on the insulating base member, and
   connecting parts of the second wires to the second-conductivity-type electrodes of the one solar cell are separated from respective adjacent connecting parts of the second wires to the first-conductivity-type electrodes of the other solar cell by respective through holes extending through both the second wires and the insulating base member.

5. The wiring sheet according to claim 4, wherein the wires are fixedly attached onto the insulating base member such that the wires each have parts of side faces thereof fixedly attached by an adhesive.

6. The wiring sheet according to claim 4, wherein the holes each have a width in the orthogonal direction larger than a width of the second wires in the orthogonal direction.

7. The wiring sheet according to claim 4, wherein the through holes each have, in a plan view thereof, a profile made of a continuous line with no corners.

8. The wiring sheet according to claim 4, wherein the through holes are located in areas where none of the solar cells are to be disposed.

9. The wiring sheet according to claim 4, wherein the through holes are partially located in an area where either one or both of the two adjacent solar cells is/are to be disposed.

10. The solar cell module according to claim 1, wherein
a width of the respective through holes in a perpendicular direction intersecting the cell array direction is longer than a width of the second wires in the perpendicular direction.

* * * * *